(12) United States Patent
Thiesfeld

(10) Patent No.: US 6,295,010 B1
(45) Date of Patent: Sep. 25, 2001

(54) 8B/10B ENCODER SYSTEM AND METHOD

(75) Inventor: Charles W. Thiesfeld, Lakeville, MN (US)

(73) Assignee: Seagate Technology, LLC, Scotts Valley, CA (US)

( * ) Notice: Subject to any disclaimer, the term of this patent is extended or adjusted under 35 U.S.C. 154(b) by 0 days.

(21) Appl. No.: 09/345,913

(22) Filed: Jul. 1, 1999

Related U.S. Application Data

(60) Provisional application No. 60/091,556, filed on Jul. 2, 1998.

(51) Int. Cl.[7] ............................................. H03M 7/14
(52) U.S. Cl. .................................... 341/58; 341/59
(58) Field of Search ................................. 341/58, 59

(56) References Cited

U.S. PATENT DOCUMENTS

| | | | |
|---|---|---|---|
| 4,486,739 | 12/1984 | Franaszek et al. | 34/347 DD |
| 4,617,552 | * 10/1986 | Kojima et al. | 340/347 DD |
| 5,177,482 | * 1/1993 | Cideciyan et al. | 341/59 |
| 5,361,261 | * 11/1994 | Edem et al. | 370/85.3 |
| 5,387,911 | * 2/1995 | Gleihert et al. | 341/95 |
| 5,592,160 | * 1/1997 | Bennett et al. | 341/58 |
| 5,651,033 | * 7/1997 | Gregg et al. | 375/354 |
| 5,663,724 | 9/1997 | Westby | 341/59 |

OTHER PUBLICATIONS

"Fibre Channel—Arbitrated Loop (FC–AL–2)—Rev 6.3", NCITS Working Draft Proposal, American National Standard for Information Technology, pp. 1–125., (May 29, 1998).

"Fibre Channel—Physical and Signaling Interface (FC–PH)—Rev 4.3", Proposed Working Draft, American National Standard for Informations Systems, pp. 1–387., (Jun. 1, 1994).

* cited by examiner

Primary Examiner—Michael Tokar
Assistant Examiner—Vibol Tan
(74) Attorney, Agent, or Firm—Schwegman, Lundberg, Woessner & Kluth, P.A.

(57) ABSTRACT

According to one embodiment of the present invention a number of input bits are received in a first encoder circuit and the input bits are encoded to generate encoded bits in the first encoder circuit. An input disparity bit is generated from the encoded bits, and the input bits and the input disparity bit are received in a second encoder circuit. The input bits are then encoded into a number of output bits based on the input disparity bit in the second encoder circuit. According to another embodiment of the present invention an encoder system includes a first encoder circuit having a number of inputs coupled to receive a number of input signals, to encode the input signals, and to generate a disparity signal at an output based on the encoded input signals. The encoder system also includes a second encoder circuit having a number of inputs coupled to receive the input signals and the disparity signal to encode the input signals into a number of output signals at a number of outputs based on the disparity signal.

19 Claims, 8 Drawing Sheets

8B/10B ENCODER SYSTEM AND METHOD

RELATED APPLICATION

This application claims the benefit of U.S. Provisional Application Ser. No. 60/091,556, filed Jul. 2, 1998 under 35 USC 119(e).

FIELD OF THE INVENTION

The present invention relates to the field of interfaces in information handling systems. More particularly, this invention relates to an 8B/10B encoder in an interface of an information handling system.

BACKGROUND OF THE INVENTION

One of the key devices of any computer system is a place to store data. Computer systems have many different places where data can be stored. One common place for storing massive amounts of data is a disc drive. The most basic parts of a disc drive are a disc that is rotated and on which data is stored, an actuator that moves a transducer to various locations over the disc, and electrical circuitry that is used to write data to and read data from the disc through the transducer. Data is stored on one or both surfaces of the disc. The disc drive also includes circuitry for encoding data written to the disc and for decoding data retrieved from the disc. A microprocessor controls most of the operations of a disc drive including passing information, such as instructions or data, read from the disc back to a requesting computer and taking information from the requesting computer for writing to the disc.

The disc drive communicates with other devices in a computer system such as the requesting computer over an interface. The performance of the computer system depends in part on the bandwidth of the interface. The bandwidth determines the speed with which information signals may be transmitted over the interface. The performance of the computer system improves with increases in the bandwidth of the interface which results in a faster transfer of information signals between the devices in the computer system.

A fibre channel is one example of an interface with a high bandwidth. The fibre channel is a standardized interface described in AMERICAN NATIONAL STANDARDS INSTITUTE, FIBRE CHANNEL—PHYSICAL AND SIGNALING INTERFACE (FC-PH) (Rev 4.3 1994). The fibre channel is a point-to-point physical interface, transmission protocol, and signaling protocol of a serial link for the support of higher level transmission protocols for controlling the communication of information including data and instructions. One of the higher level protocols is described in AMERICAN NATIONAL STANDARDS INSTITUTE, FIBRE CHANNEL—ARBITRATED LOOP (FC-AL-2) (Rev 6.3 1998).

Information signals, including data or instructions, are generated and manipulated in devices of the computer system as digital signals. The digital signals are manipulated and transferred inside the devices in bytes of 8 bits each. The bytes are encoded and expanded into transmission characters having 10 bits each, and put in serial form before being transmitted from a device over the fibre channel. The encoding is done according to an 8B/10B transmission code specified in FC-PH. The transmission characters are deserialized and decoded into bytes upon being received from the fibre channel in a succeeding device. Digital devices called 8B/10B encoders and decoders have been developed to carry out the encoding and decoding according to the 8B/10B transmission code.

The 8B/10B transmission code is a binary code comprising a series of "1's," also called high signals, and "0's," also called low signals. Each transmission character in the 8B/10B transmission code is comprised of either four 1's and six 0's, five 1's and five 0's, or six 1's and four 0's. The disparity of a transmission character is the difference between the number of 1's and the number of 0's. A transmission character with six 1's has a positive disparity, with five 1's has a neutral disparity, and with four 1's has a negative disparity. The 8B/10B encoders select the disparity of the transmission characters to maintain a balance between high and low signals transmitted over the fibre channel. For example, if a transmission character with a positive disparity is transmitted the 8B/10B encoder will keep track of the disparity and encode the following characters with either a neutral or a negative disparity. Similarly, if a transmission character with a negative disparity is transmitted the 8B/10B encoder will encode the following characters with either a neutral or a positive disparity.

Conventional 8B/10B encoders are divided into two portions, a 5B/6B portion that encodes a 5 bit input into a 6 bit output, and a 3B/4B portion that encodes a 3 bit input into a 4 bit output. The encoding is completed in a single clock cycle. A disparity bit is passed from the 5B/6B portion to the 3B/4B portion to govern the disparity of the output bits based on the disparity of previously transmitted bits. Often two or more 8B/10B encoders are coupled in parallel to encode multiple bytes during a single clock cycle, and a disparity bit is passed or rippled through the encoders to govern the disparity of the output bits. The disparity bit may change depending on the disparity of the output bits in each portion of the 8B/10B encoders that the disparity bit passes through. The ripple of the disparity bit therefore absorbs a substantial amount of time, and each clock cycle must be long enough to allow the disparity bit to pass through each of the portions of the 8B/10B encoders before succeeding bytes are encoded in a subsequent clock cycle. The speed with which the 8B/10B encoders produces output bits to be transmitted has a substantial impact on the bandwidth of the fibre channel. There remains a need for 8B/10B encoder systems that encode bytes more rapidly to support higher bandwidths.

Summary of the Invention According to one embodiment of the present invention a number of input bits are received in a first encoder circuit and the input bits are encoded to generate encoded bits in the first encoder circuit. An input disparity bit is generated from the encoded bits, and the input bits and the input disparity bit are received in a second encoder circuit. The input bits are then encoded into a number of output bits based on the input disparity bit in the second encoder circuit. According to another embodiment of the present invention an encoder system includes a first encoder circuit having a number of inputs coupled to receive a number of input signals, to encode the input signals, and to generate a disparity signal at an output based on the encoded input signals. The encoder system also includes a second encoder circuit having a number of inputs coupled to receive the input signals and the disparity signal to encode the input signals into a number of output signals at a number of outputs based on the disparity signal.

Advantageously, the embodiments of the present invention generate a disparity signal for the input signals in the first encoder circuit before the input signals are encoded for transmission, and the disparity signal is provided to a second encoder circuit to encode the input signals with the desired disparity. The encoder system and the method eliminate the need for a disparity bit to migrate through two encoder circuits, and the encoding may be accomplished in a shorter time period. The encoder system and the method therefore encode input signals more rapidly than existing encoder systems.

DESCRIPTION OF THE PREFERRED EMBODIMENT

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

In this description information, including data or instructions, will be described as being transmitted in a digital signal comprising bits. The digital signal may be a voltage signal transmitted over an electrically conductive medium such as a copper wire, an acoustic signal, an optical signal transmitted through optics or over an optical medium such as an optical fibre, or another type of electromagnetic wave signal such as a radio signal. The embodiments of the invention described herein may be implemented in conjunction with transmission mediums for any of the types of digital signals listed above. Also in this description a digital signal of "1" or one may also be called a high signal and a digital signal of "0" or zero may also be called a low signal.

Figure 1:
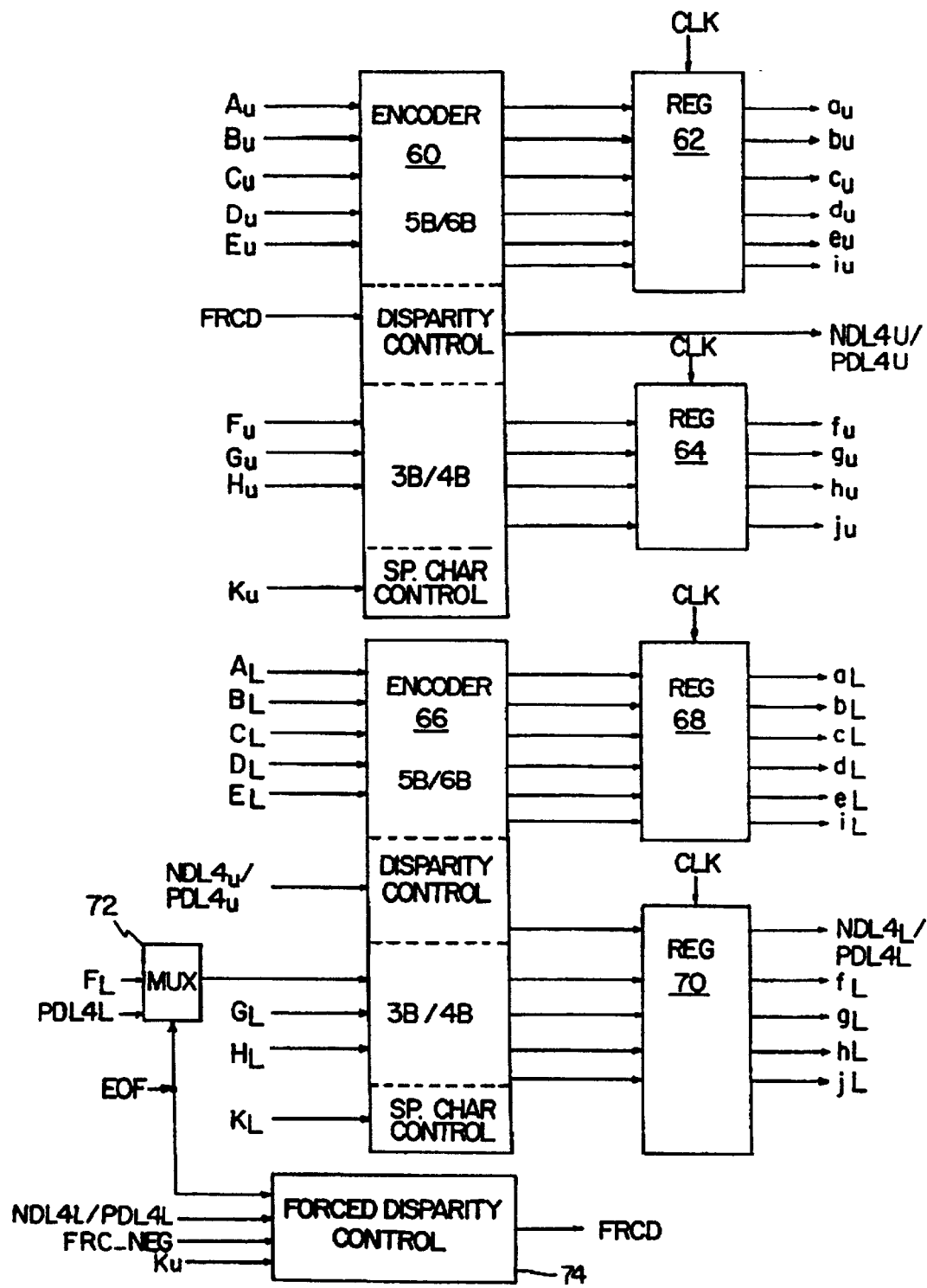
FIG. 1 is a block diagram of an encoder according to the prior art.
Figure 2:
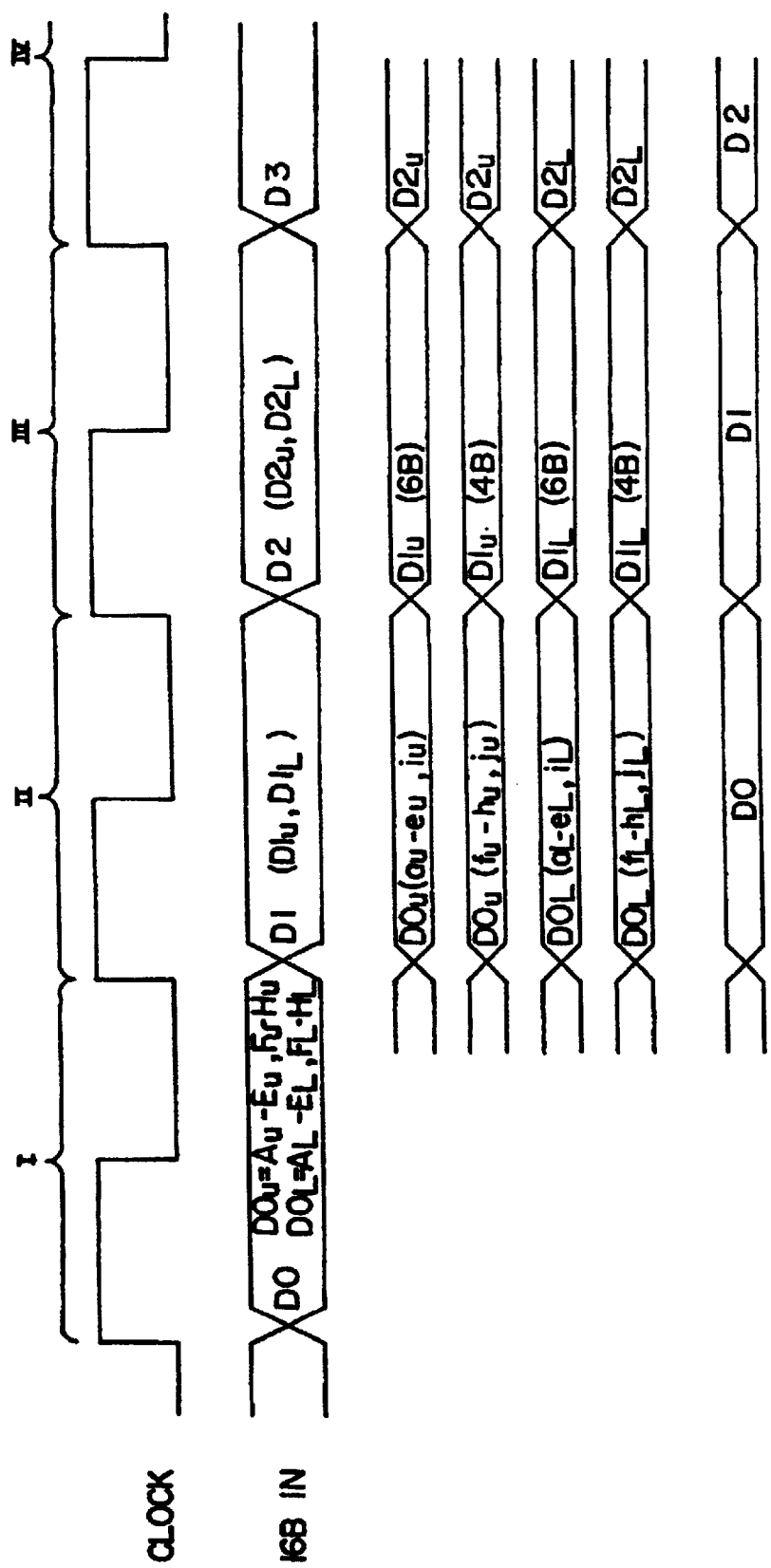
FIG. 2 is a timing diagram of the encoder shown in FIG. 1.

A block diagram of a 16B/20B encoder system 10 disclosed in U.S. Pat. No. 5,663,724 is shown in FIG. 1, and timing diagram of the system 10 is shown in FIG. 2. The system 10 includes upper and lower 8B/10B encoders 60, 66, coupled in parallel. Each of the encoders 60, 66 is divided into a 5B/6B portion encoding 5 bits into a 6 bit output and a 3B/4B portion encoding 3 bits into a 4 bit output. The system 10 is coupled to receive two bytes in parallel having bits represented by the upper case characters ABCDEFGH with subscripts u and L indicating upper and lower bytes, respectively. The system 10 is also coupled to receive upper and lower control bits $K_u$ and $K_L$. The bytes ABCDEFGH are encoded and expanded into two transmission characters in parallel having bits represented by the lower case characters abcdeifghj with subscripts u and L indicating upper and lower transmission characters, respectively. The transmission characters are coupled to additional circuitry (not shown) to be put in serial form before being transmitted over a fibre channel. An upper disparity bit $NDL4_u/PDL4_u$ and a lower disparity bit $NDL4_L/PDL4_L$ are also generated as will be further explained hereinbelow.

The system 10 operates in the following manner. During clock cycle I, the encoders 60, 66 encode the bytes ABCDEFGH in the following manner. The 5B/6B portion of the encoder 60 encodes the bits ABCDE of the upper byte into the bits abcdei of the upper transmission character. A disparity bit indicating the disparity of the bits abcdei of the upper transmission character is passed to the 3B/4B portion of the encoder 60 to selectively complement or not complement the bits fghj. The disparity bit is selected to complement the bits fghj if the disparity of the bits fghj is such as to make a negative disparity of the upper transmission character more negative or a positive disparity of the upper transmission character more positive. The bits fghj are not complemented if the disparity of the bits fghj is neutral, or if the disparity of the bits fghj would make a positive disparity of the upper transmission character more negative or a negative disparity of the upper transmission character more positive.

The upper disparity bit $NDL4_u/PDL4_u$ indicates the disparity of the bits fghj of the upper transmission character and is passed from the encoder 60 to a disparity control portion of the encoder 66 where it is applied to selectively complement the bits abcdei of the lower transmission character output by the 5B/6B portion. A disparity bit indicating the disparity of the bits abcdei of the lower transmission character is passed to the 3B/4B portion of the encoder 66 to selectively complement the bits fghj of the lower transmission character. The lower disparity bit $NDL4_L/PDL4_L$ indicating the disparity of the bits fghj of the lower transmission character is output to register 70 where it is provided to a disparity control portion of the encoder 60 in clock cycle II through a forced disparity control circuit 74 to selectively complements the bits abcdei of the upper transmission character produced from a succeeding upper byte received in the encoder 60 in clock cycle II. The bits abcdeifghj generated by the encoders 60, 66 in clock cycle I are coupled through four registers 62, 64, 68, and 70 in clock cycle II.

The system 10 thereby encodes two bytes into two transmission words every clock cycle. In a single clock cycle, for example clock cycle I, a disparity bit is passed from the 5B/6B portion to the 3B/4B portion of the encoder 60 to the 5B/6B portion and the 3B/4B portion of the encoder 66. The clock cycle is selected to be long enough to accommodate the ripple of the disparity bit through the system 10. The length of the clock cycle limits the speed with which the system 10 produces output bits to be transmitted has a substantial impact on the bandwidth of a fibre channel receiving the transmission words.

Figure 3:
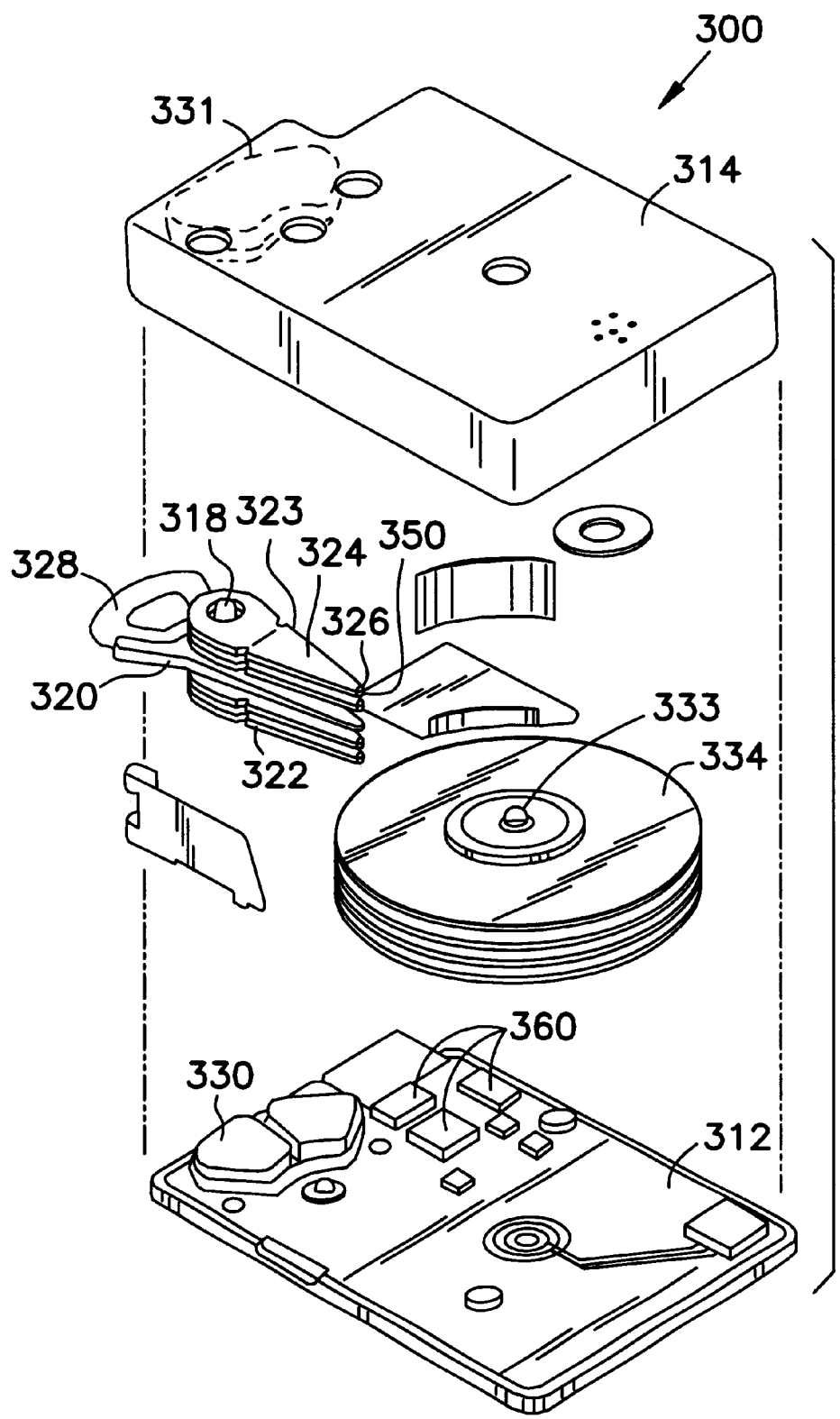
FIG. 3 is an exploded view of a disc drive according to an embodiment of the present invention.

The embodiments of the present invention described in this application are useful with all types of disc drives having either rotary or linear actuation, including hard disc drives, zip drives, floppy disc drives. An exploded view of a disc drive 300 having a rotary actuator according to an embodiment of the present invention is shown in FIG. 3. The disc drive 300 includes a housing or base 312 and a cover 314. The base 312 and cover 314 form a disc enclosure. Rotatably attached to the base 312 on an actuator shaft 318 is an actuator assembly 320. The actuator assembly 320 includes a comb-like structure 322 having a plurality of arms 323. Load beams or load springs 324 are attached to each arm 323 on the comb 322, and the load beams or load springs are also referred to as suspensions. Attached at the end of each load spring 324 is a slider 326 which carries a magnetic transducer 350. The slider 326 is a small ceramic block which is passed over one of several discs 334 as the disc 334 rotates so that the transducer 350 may read data from or write data to the disc 334. The transducer 350 is balanced over the disc 334 between a force from the load spring 324 and air pressure caused by the rotation of the disc 334. The slider 326 and the transducer 350 form what may be called a read/write head. It should also be noted that the embodiments of the present invention described herein are equally applicable to sliders 326 having more than one transducer 350, such as what is known as an MR or magneto resistive head in which one transducer 350 is generally used for reading and another is generally used for writing. On the end of the actuator assembly 320 opposite the load springs 324 and he sliders 326 is a voice coil 328.

Attached within the base 312 is a first magnet 330, and a second magnet 331 is attached to the cover 314. The first and second magnets 330, 331, and the voice coil 328 are components of a voice coil motor which applies a force to the actuator assembly 320 to rotate it about the actuator shaft 318. Also mounted to the base 312 is a spindle motor. The spindle motor includes a rotating portion called a spindle hub 333. In the disc drive 300, the spindle motor is within the spindle hub 333, and a number of discs 334 are attached to the spindle hub 333. The embodiments of the present invention described herein are equally applicable to disc drives which have a plurality of discs as well as disc drives that have a single disc attached to a spindle hub, and to disc drives with spindle motors which are under a spindle hub. Servo feedback information is used to accurately locate the transducer 350. The actuator assembly 320 is moved to and held at a precise position during a read or write operation using the servo information.

The disc drive 300 includes one or more integrated circuits 360 coupled to the transducer 350 in the slider 326 for providing a signal to the transducer 350 when data is being written to the discs 334 and for receiving and processing a signal from the transducer 350 when data is being read from the discs 334. One or more of the circuits 360 are coupled to a port (not shown) for exchanging signals with other devices through an interface such as a fibre channel. Data to be written to the discs 334 is received through the port, and data read from the discs 334 is sent to other devices through the port. The circuits 360 include one or more 8B/10B encoders for encoding information signals transmitted on to the fibre channel. The circuits 360 may also include a microprocessor or one or more state machines to control operations of the disc drive 300.

Figure 4:
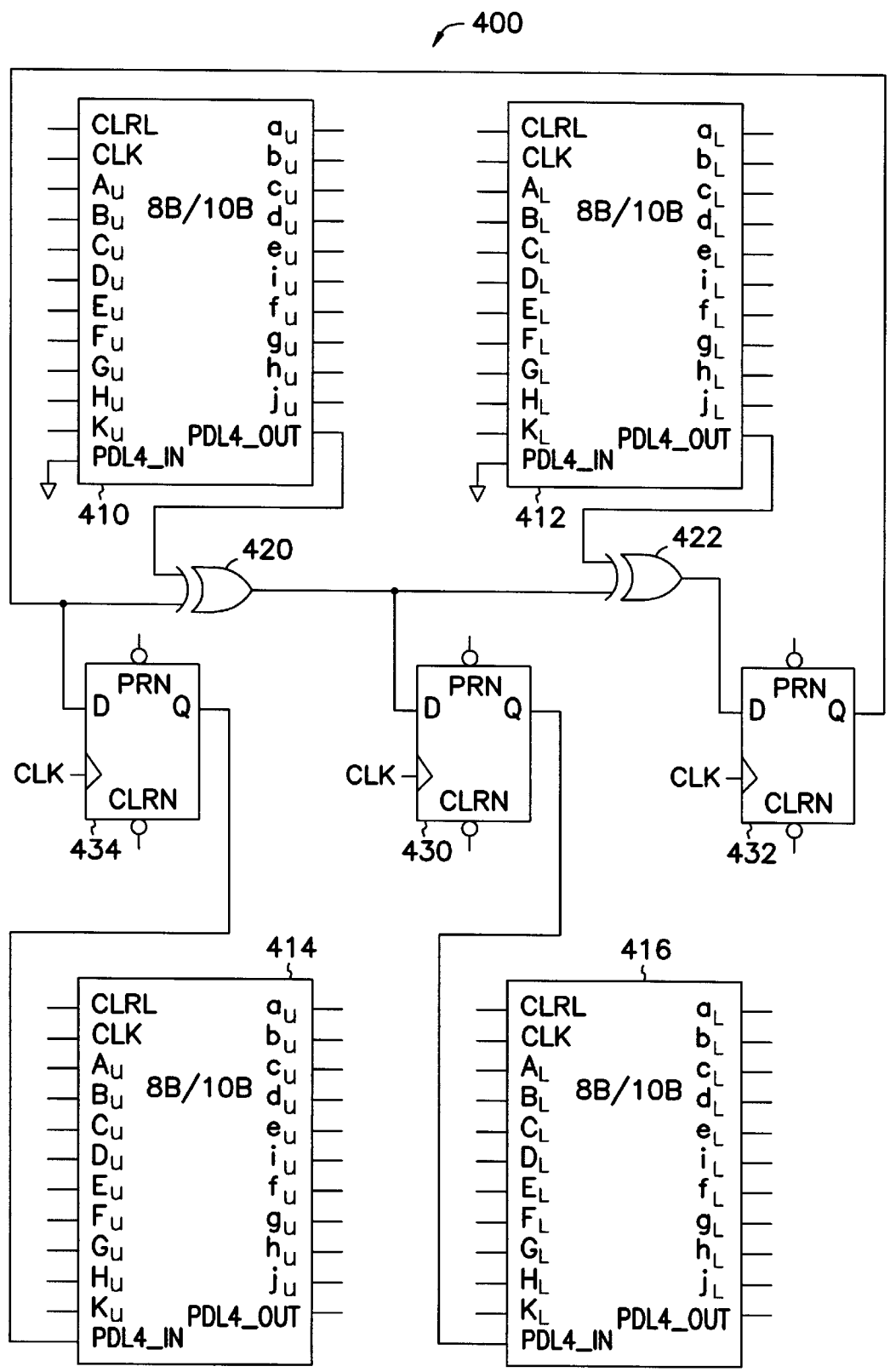
FIG. 4 is a block diagram of an encoder system according to an embodiment of the present invention.

A block diagram of an 8B/10B encoder system 400 according to an embodiment of the present invention is shown in FIG. 4. The system 400 includes four 8B/10B encoders 410, 412, 414, and 416. The encoders 410, 412 are used to determine whether upper and lower transmission characters encoded from upper and lower bytes have a neutral disparity or a non-neutral disparity in a first clock cycle. This information is relayed to the encoders 414, 416 which encode the bytes into the transmission characters in a second clock cycle following the first clock cycle. The disparity information for each transmission character is determined one clock cycle before it is encoded for transmission so there is no need to have a clock cycle that is long enough for a disparity bit to ripple through two encoders. The system 400 alternates the transmission characters with a non-neutral disparity between a positive disparity and a negative disparity to maintain a balance between high and low signals in the transmitted signals. Advantages of the present invention will be apparent to those skilled in the art with the benefit of the following description.

Each of the encoders 410, 412, 414, 416 are coupled to receive a byte at pins ABCDEFGH. Each encoder is also coupled to receive a control bit at a pin K, a clear signal at a pin CLRL and a clock signal at a pin CLK. In each encoder the byte coupled to the pins ABCDEFGH is encoded into a transmission character on pins abcdeifghj. Each encoder includes a pin PDL4_IN to receive an input disparity bit which determines the disparity of the transmission character. If the input disparity bit is high the disparity of the transmission character is positive, and if the input disparity bit is low the disparity of the transmission character is negative. Each encoder includes a pin PDL4_OUT on which is generated an output disparity bit. If the output disparity bit is low then the disparity of the transmission character generated by the encoder is neutral, and if the output disparity bit is high then the disparity of the transmission character is either positive or negative.

The encoders 410, 412, 414, 416 are coupled together to form the system 400 in the following manner. The pin PDL4_OUT of the encoder 410 is connected to a first input of an exclusive-OR (XOR) gate 420, and the pin PDL4_OUT of the encoder 412 is connected to a first input of an XOR gate 422. An output of the XOR gate 420 is connected to a second input of the XOR gate 422 and to an input of a D flip-flop 430. An output of the XOR gate 422 is connected to an input of a D flip-flop 432. An output of the D flip-flop 432 is connected to a second input of the XOR gate 420 and to an input of a D flip-flop 434. Outputs of the D flip-flops 434, 430 are connected respectively to provide input disparity bits to the pins PDL4_IN of the encoders 414, 416.

Figure 5:
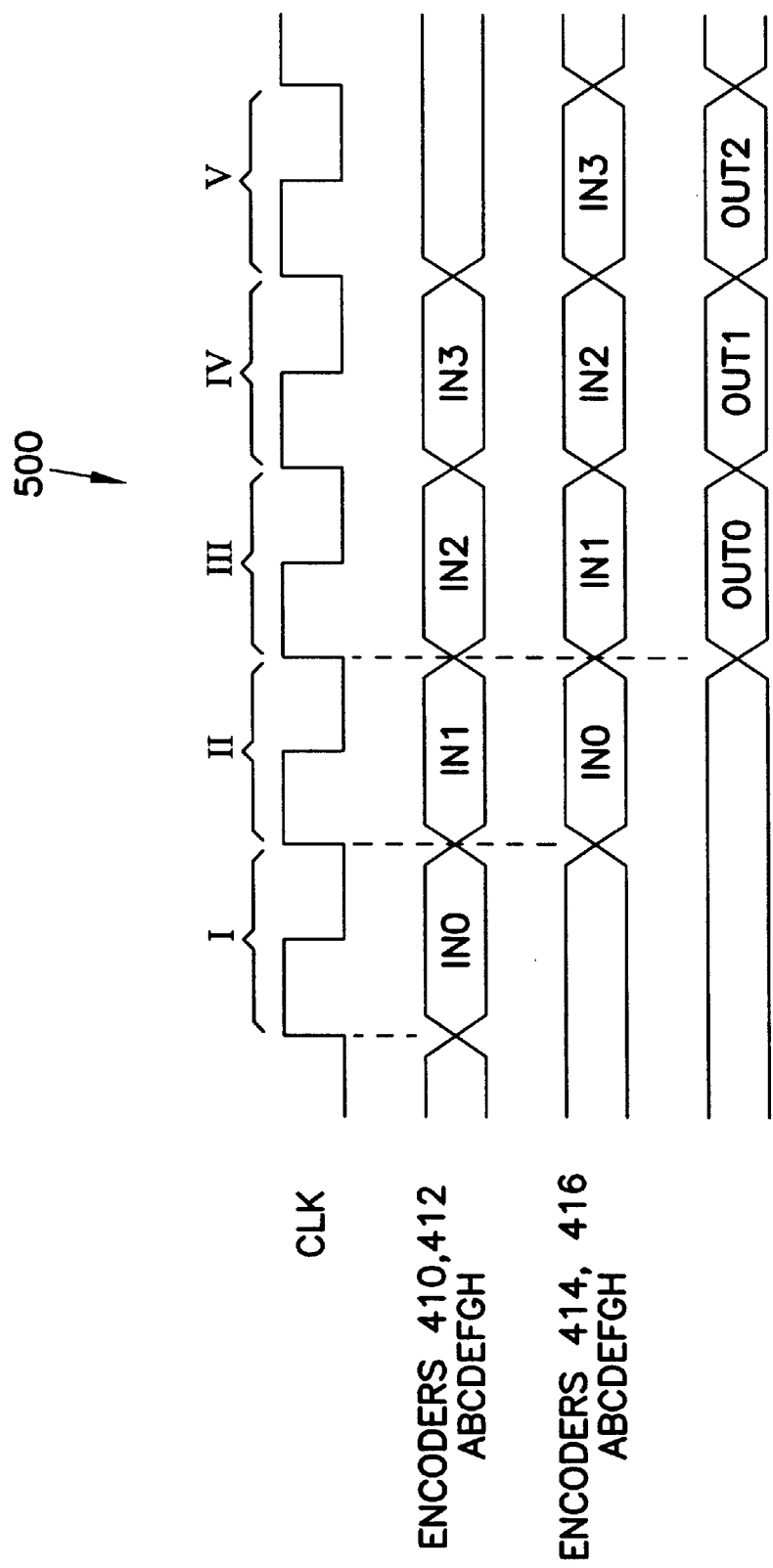
FIG. 5 is a timing diagram for the encoder system shown in FIG. 4.

The operation of the system 400 will be described according to a timing diagram 500 shown in FIG. 5. Each of the encoders 410, 412, 414, 416 changes state on the same clock signal CLK. In clock cycle I, a pair of bytes IN0 are presented respectively to the pins ABCDEFGH of the encoders 410, 412 which encode the bytes IN0 into transmission characters at the pins abcdeifghj. Two output disparity bits are generated for the transmission characters at the respective pins PDL4_OUT and are presented to the first inputs of the XOR gates 420, 422. The pins PDL4_IN of the encoders 410, 412 are coupled to ground because the type of disparity of the transmission characters produced does influence the output disparity bits. Input disparity bits for the encoders 414, 416 are generated at the outputs of the XOR gates 422, 420. The output disparity bits modify the input disparity bits in the following manner. If a transmission character has a neutral disparity its corresponding output disparity bit is 0 and the XOR gate 422, 420 receiving it will pass the input disparity bit from its second input to its output unchanged. If the transmission character has a positive or negative disparity its corresponding output disparity bit is 1 and the XOR gate 422, 420 receiving it reverses the input disparity bit between its second input and its output. The input disparity bits are presented to the inputs of the D flip-flops 430, 432 to be relayed in clock cycle B. The input of the D flipflop 434 stores the input disparity bit produced by the XOR gate 422 in the clock cycle immediately preceding clock cycle I to be relayed in clock cycle II. This input disparity bit is based on the disparity of the transmission character from the encoder 412 in the clock cycle immediately preceding clock cycle I.

In clock cycle II the bytes IN0 are presented to the pins ABCDEFGH of the encoders 414, 416. In some embodiments of the present invention, the bytes IN0 are retained in a storage element such as a register (not shown) to present the bytes IN0 to the encoders 414, 416 one clock cycle after the bytes IN0 are presented to the encoders 410, 412, as shown in the timing diagram 500. The input disparity bit that is based on the disparity of the transmission character from the encoder 410 is relayed to the pin PDL4_IN of the encoder 416 through the D flip-flop 430. The input disparity bit based on the disparity of the transmission character from the encoder 412 in the clock cycle immediately preceding clock cycle I is relayed to the pin PDL4_IN of the encoder 414 through the D flip-flop 434. The encoders 414, 416 generate transmission characters OUT0 from the pins abcdeifghj having a positive or negative disparity determined by the input disparity bits. Of course, the transmission characters may both have neutral disparity, and if so the input disparity bits are passed through unchanged to the next clock cycle through the XOR gates 420, 422. Also in clock cycle II a new pair of bytes IN1 is coupled to the pins ABCDEFGH of the encoders 410,412 and a succeeding set of input disparity bits is generated.

The disparity of the transmission character from the encoder 412 in clock cycle I results in an input disparity bit that is relayed from the D flip-flop 432 to the input of the D flip-flop 434 for transfer in clock cycle m. In this manner the system 400 stores the last disparity bit from the current clock cycle to be used at the beginning of the next clock cycle, and a balance between high and low signals is maintained through succeeding clock cycles.

In clock cycle III transmission characters OUT0 encoded from the bytes IN0 are made available for transmission by circuitry (not shown) that is coupled to the pins abcdeifghj of the encoders 414, 416. The bytes IN1 are coupled to the pins ABCDEFGH of the encoders 414, 416 to be encoded. Finally, a new pair of bytes IN2 is coupled to the pins ABCDEFGH of the encoders 410, 412 and a succeeding set of input disparity bits is generated. The bytes IN1 and IN2 are eventually encoded into transmission characters OUT1 and OUT2 and made ready for transmission, and a new pair of bytes IN3 is received in clock cycles IV and V.

In the system 400 disparity bits for bytes are generated one clock cycle before the bytes are encoded into transmission characters. The disparity bits are then relayed to a set of encoders in a subsequent clock cycle to determine the disparity of the transmission characters. The system 400 eliminates the need for a disparity bit to migrate through multiple encoders, and the encoding may be accomplished with a shorter clock cycle.

The system 400 does not take up much more area in an integrated circuit than conventional systems because the pins abcdeifghj in the encoders 410, 412 and the pins PDL4_OUT in the encoders 414, 416 are not used and are left floating, or unconnected to additional circuitry.

In alternative embodiments of the present invention the system 400 has more than four 8B/10B encoders if more than two bytes are to be encoded in each clock cycle, and each additional byte is encoded by an additional pair of 8B/10B encoders. For example, if four bytes are to be encoded in parallel, the system 400 would include eight 8B/10B encoders. The additional encoders would be coupled to the system 400 in a manner analogous to the coupling shown in FIG. 4. The input disparity bit that is generated based on the last transmission character encoded in the system 400 would be stored to encode the first of a subsequent set of bytes. In alternative embodiments of the present invention the system 400 is implemented in Field Programmable Gate Arrays (FPGA) or Application Specific Integrated Circuits (ASIC).

Figure 6:
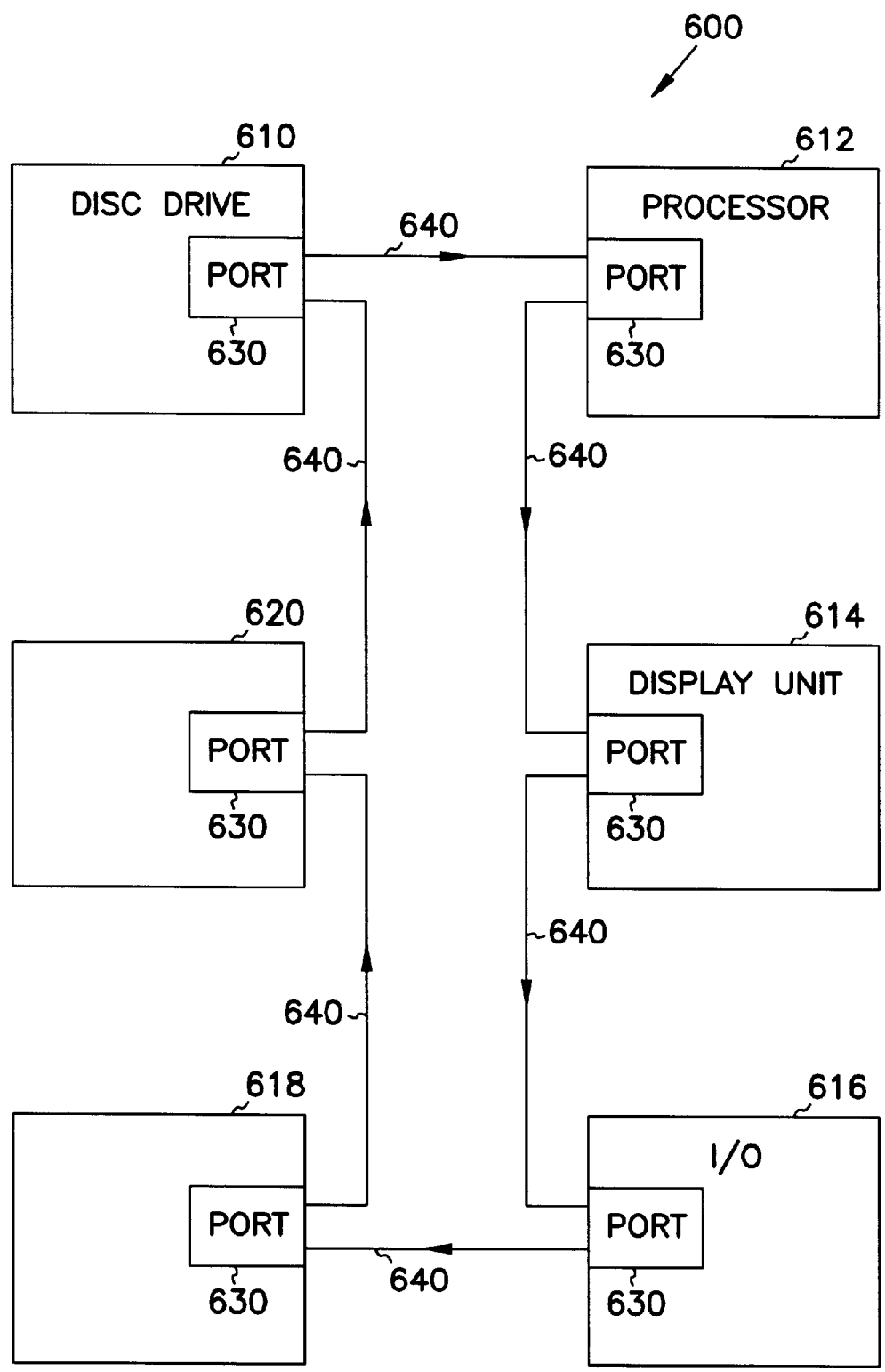
FIG. 6 is a block diagram of an information handling system according to an embodiment of the present invention.

A block diagram of a fibre channel arbitrated loop 600 linking devices in an information handling system according to an embodiment of the present invention is shown in FIG. 6. Each of the devices includes an encoder system similar to the encoder system 400 described above and shown in FIG. 4. The loop 600 includes a disc drive 610, a processor 612, a display unit 614, and an input/output (I/O) subsystem 616. In some embodiments the processor 612 is a microprocessor. Two other devices 618, 620 are also linked to the loop 600. Each of the devices 610–620 is called a node in the loop 600, and is linked to the loop 600 by a node-loop port 630. Each port 630 includes a pair of fibres 640, an incoming fibre 640 to carry information signals into the port 630 from a preceding node and an outgoing fibre 640 to carry information signals out of the port 630 to a succeeding node. In alternative embodiments of the present invention each of the fibres 640 is a coaxial wire such as a coaxial copper conductor, and may also comprise an optical fibre for some or all of its length. Information signals including data or instructions are digital signals transmitted serially over the fibres 640. The pair of fibres 640 connected to each port is called a link and is part of the loop 600.

In alternative embodiments of the present invention each of the devices 618, 620 is a data storage device such as a floppy disk drive, an optical disk drive, a CD ROM, or a tape drive. The display unit 614 is a monitor in some embodiments. The I/O device 616 is a modem in some embodiments. Each of the devices 618, 620 may also be a processor-based device such as a fabric controller, a network interface card, a camera, a video game, a hand-held calculator, a television set-top box, a fixed-screen telephone, a smart mobile phone, a personal digital assistant (PDA), a network computer (NC), a hand-held computer, a personal computer, or a multiprocessor supercomputer; an information appliance such as, for example, a cellular telephone, a pager, or a daily planner or organizer; an information component such as, for example, a telecommunications modem; or an appliance such as, for example, a hearing aid, a washing machine, or a microwave oven having an electronic controller.

Figure 7:
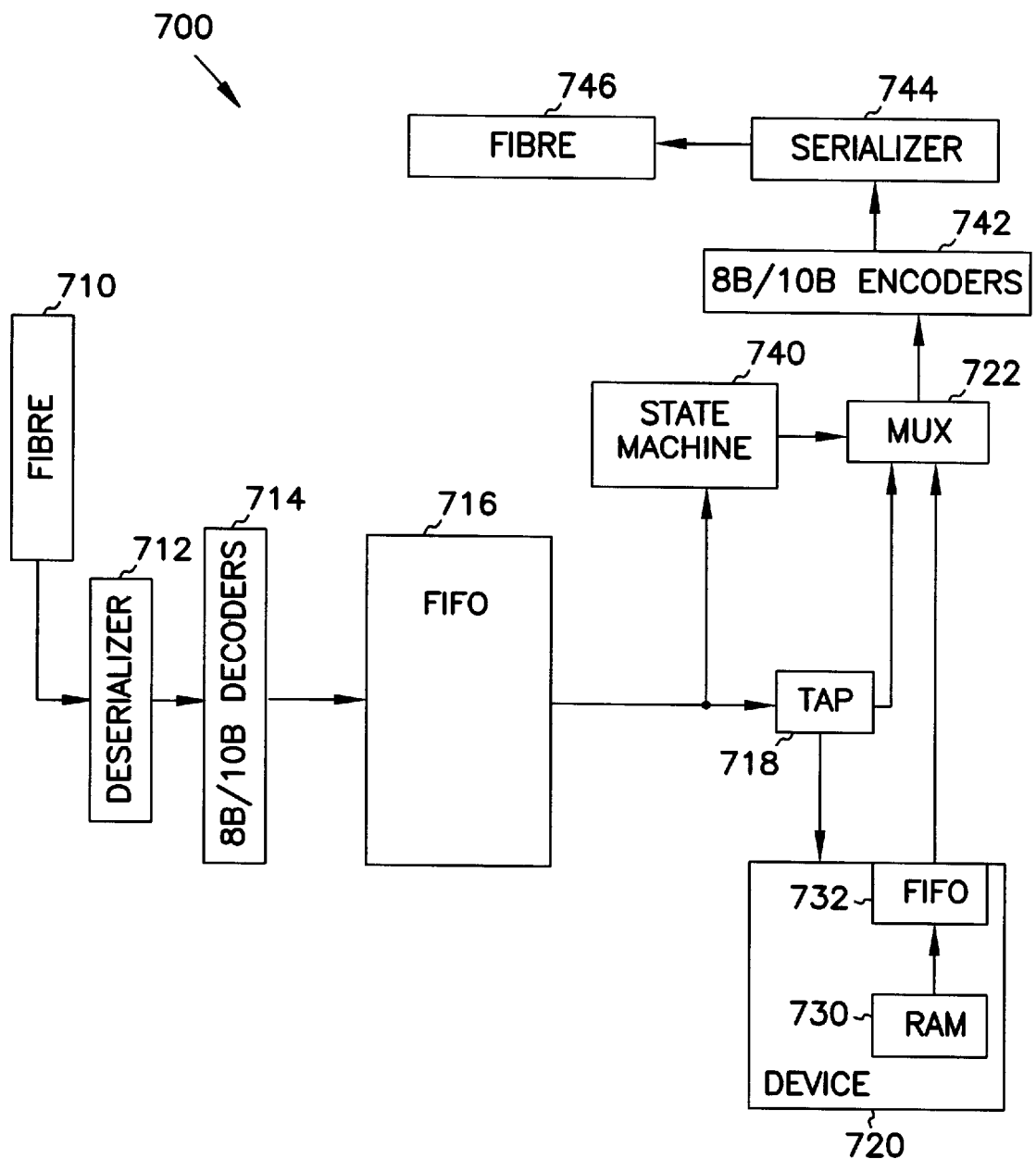
FIG. 7 is a block diagram of a node-loop port according to an embodiment of the present invention.

A block diagram of a node-loop port 700 in a node coupled to a loop according to an embodiment of the present invention is shown in FIG. 7. The port 700 is similar to the ports 630 shown in FIG. 6. The port 700 is coupled to receive a serial information signal from a preceding node through an incoming fibre 710. The information signal is deserialized into a parallel signal in a deserializer 712, and the parallel signal is decoded by 8B/10B decoders 714. The port 700 may be implemented in either bit-, byte-, half-word- (two bytes), or word- (four bytes) wide units. In this description the parallel signal generated by the deserializer 712 will be described as a half-word. A first-in, first-out (FIFO) buffer 716 receives and temporarily stores the half-word and then provides the half-word to a tap 718 which directs the half-word to a device 720 or to a multiplexer 722. The action of the tap 718 is indicated by whether the device 720 is to receive the half-word from the incoming fibre 710, or the half-word is to be passed on through to the next node. The device 720 includes a random access memory (RAM) 730 and a FIFO buffer 732 for transmitting information to the loop. The FIFO buffer 732 is coupled to provide the information to the multiplexer 722 which is controlled by a state machine 740. The state machine 740 also receives the half-word from the FIFO buffer 716 and directs the multiplexer 722 to pass either the half-word or the information to 8B/10B encoders 742. Output from the 8B/10B encoders 742 is passed to a serializer 744 to be transmitted through an outgoing fibre 746 to a succeeding node. The 8B/10B encoders 742 are similar to the encoder system 400 described above with reference to FIG. 4.

Figure 8:
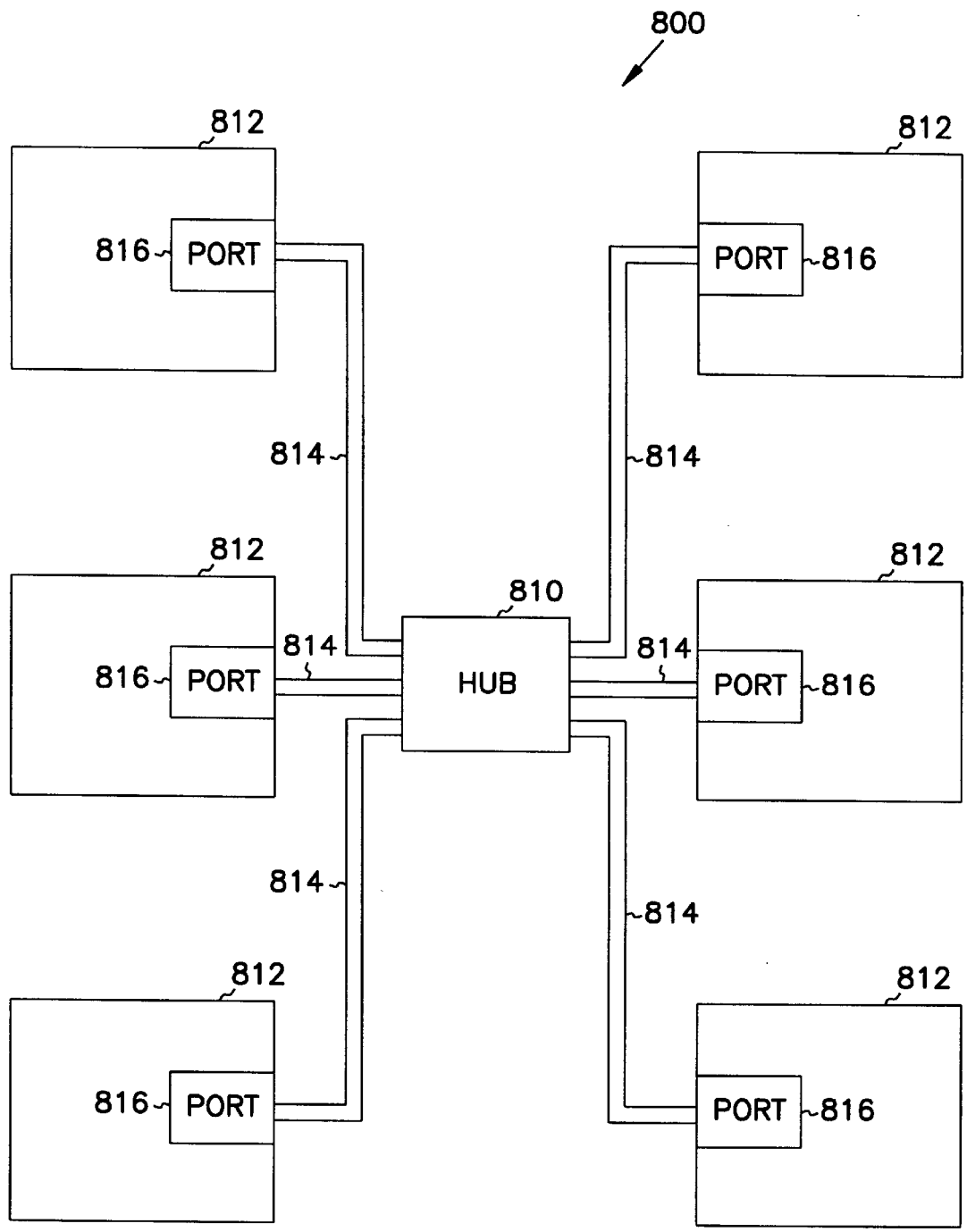
FIG. 8 is a block diagram of an information handling system according to an embodiment of the present invention.

A block diagram of an information handling system 800 according to an embodiment of the present invention is shown in FIG. 8. The system 800 is structured in a star configuration around a hub 810 which includes a processor. The hub 810 is coupled to each of several devices 812 through a point-to-point fibre channel interface 814. Each fibre channel interface 814 comprises two fibres coupled in parallel between a port (not shown) in the hub 810 and a port 816 in a respective device 812. The ports in the hub 810 and the ports 816 are similar to the port 700 shown in FIG. 7. Each of the ports in the hub 810 and the ports 816 includes one or more 8B/10B encoders similar to the encoder system 400 described above with reference to FIG. 4. The devices 812 may include a disc drive, a display unit, an I/O subsystem, and any of the devices listed above in conjunction with the information handling system shown in FIG. 6.

An advantage of the embodiments of the invention described above is that the disparity bits for bytes are generated one clock cycle before the bytes are encoded into transmission characters. The disparity bits are then relayed to a set of encoders in a subsequent clock cycle to determine the disparity of the transmission characters. The system 400 eliminates the need for a disparity bit to migrate through multiple encoders, and the encoding may be accomplished with a shorter clock cycle. The system 400 therefore encodes bytes more rapidly than existing encoder systems.

Conclusion

In conclusion, a method of encoding is disclosed. A plurality of input bits ABCDEFGH are received in a first encoder circuit 410, 412, and the input bits ABCDEFGH are encoded to generate encoded bits abcdeifghj in the first encoder circuit 410, 412. An input disparity bit PDL4_IN is generated from the encoded bits abcdeifghj, and the input bits ABCDEFGH and the input disparity bit PDL4_IN are received in a second encoder circuit 414,416. The input bits ABCDEFGH are encoded into a plurality of output bits abcdeifghj based on the input disparity bit PDL4_IN in the second encoder circuit 414, 416. The input bits ABCDEFGH are encoded to generate the encoded bits abcdeifghj, an output disparity bit PDL4_OUT based on a disparity of the encoded bits abcdeifghj in the first encoder circuit 410, 412, and the input disparity bit PDL4_IN is generated from the output disparity bit. An input disparity bit PDL4_IN may be generated to be equal to a preceding input disparity bit PDL4_IN if the encoded bits abcdeifghj have a neutral disparity, and the input disparity bit PDL4_IN may be generated to be different from the preceding input disparity bit PDL4_IN if the encoded bits abcdeifghj have a positive or a negative disparity. A plurality of input bits ABCDEFGH may be received in a plurality of first encoder circuits 410, 412 in a first clock cycle I and the input bits ABCDEFGH may be encoded to generate encoded bits abcdeifghj in the first encoder circuits 410, 412 in the first clock cycle I. A plurality of output disparity bits PDL4_OUT may be generated based on a disparity of the encoded bits abcdeifghj and a plurality of input disparity bits PDL_IN may be generated from the output disparity bits PDL4_OUT in the first clock cycle I. The input bits ABCDEFGH and the input disparity bits PDL4_IN may be received in a plurality of second encoder circuits 414, 416 in a second clock cycle II following the first clock cycle I, and the input bits ABCDEFGH may be encoded into a plurality of output bits abcdeifghj having a disparity determined by the input disparity bits PDL4_IN in the second encoder circuits 414, 416 in the second clock cycle II. A disparity bit is stored to be used to encode a subsequent plurality of input bits into a plurality of output bits. A plurality of input bytes ABCDEFGH may be received in a plurality of first 8B/10B encoder circuits 410, 412 in a first clock cycle I, where an 8B/10B encoder circuit is defined as an encoder circuit to encode a byte having 8 bits into a transmission character having 10 bits according to a transmission code. The input bytes ABCDEFGH may be encoded to generate a plurality of transmission characters abcdeifghj in the first 8B/10B encoder circuits 410, 412 in the first clock cycle I. A plurality of output disparity bits PDL4_OUT may be generated based on a disparity of the transmission characters abcdeifghj and a plurality of input disparity bits PDL4_IN may be generated from the output disparity bits PDL4_OUT in the first clock cycle I. The input bytes ABCDEFGH and the input disparity bits PDL4_IN may be received in a plurality of second 8B/10B encoder circuits 414,416 in a second clock cycle II following the first clock cycle I, and the input bytes ABCDEFGH may be encoded into a plurality of transmission characters abcdeifghj ehaving a disparity determined by the input disparity bits PDL4_IN in the second 8B/10B encoder circuits 414,416 in the second clock cycle II. An output disparity bit may be generated for each transmission character abcdeifghj indicating a disparity of the transmission character abcdeifghj, and an input disparity bit PDL4_IN may be generated for each output disparity bit PDL4_OUT, the input disparity bit PDL4_IN being the same as a preceding input disparity bit PDL4_IN if the disparity of the corresponding transmission character abcdeifghj is neutral and the input disparity bit PDL4_IN being different from the preceding input disparity bit PDL4_IN if the disparity of the corresponding transmission character abcdeifghj is positive or negative. One of the input disparity bits PDL4_IN generated in the first clock cycle I may be stored to be used to send to the second 8B/10B encoder circuits 414,416 to encode a subsequent plurality of input bytes in a third clock cycle III following the second clock cycle II.

An encoder system 400 is also disclosed. The encoder system 400 includes a first encoder circuit 410,412 having a plurality of inputs ABCDEFGH coupled to receive a plurality of input signals, to encode the input signals, and to generate a disparity signal at an output PDL4_OUT based on the encoded input signals. The encoder system 400 also includes a second encoder circuit 414, 416 having a plurality of inputs ABCDEFGH, PDL4_IN coupled to receive the input signals and the disparity signal to encode the input signals into a plurality of output signals at a plurality of outputs abcdeifghj based on the disparity signal. The first encoder circuit 410, 412 may include one or more first encoder circuits 410, 412 each having input pins ABCDEFGH coupled to receive input bits, a clock input CLK, and an output pin PDL4_OUT to generate an output disparity bit. The second encoder circuit 414, 416 may include one or more second encoder circuits 414, 416 each having input pins ABCDEFGH coupled to receive the input bits, a clock input CLK, an input PDL4_IN to receive an input disparity bit from the first encoder circuits 410, 412, and output pins abcdeifghj to generate encoded output bits based on the input bits and the input disparity bit. The encoder system 400 may also include an exclusive-OR gate 420, 422 for each first encoder circuit 410, 412, each exclusive-OR 420, 422 gate having a first input coupled to the output pin PDL4_OUT of a corresponding first encoder circuit 410, 412 to receive the output disparity bit and a second input coupled to receive a preceding input disparity bit, the exclusive-OR gate 420, 422 having an output to generate a subsequent input disparity bit. The encoder system 400 may also include a current storage element 430, 432 for each exclusive-OR gate, each current storage element 430, 432 to store the subsequent input disparity bit and to relay the input disparity bit to a respective one of the second encoder circuits 414, 416 in a subsequent clock cycle, and a carryover storage element 434 to store the subsequent input disparity bit of one of the first encoder circuits 410, 412 to a subsequent clock cycle. The current storage elements and the carryover storage element may each be a D flip-flop 430, 432, 434. The first encoder circuit may include two first 8B/10B encoder circuits 410, 412 each having inputs ABCDEFGH coupled to receive input bits, an output pin PDL4_OUT to generate an output disparity bit, wherein an 8B/10B encoder circuit is defined as an encoder circuit to encode a byte having 8 bits into a transmission character having 10 bits according to a transmission code. The second encoder circuit may include two second 8B/10B encoder circuits 414, 416 each having input pins ABCDEFGH coupled to receive the input bits, a clock input CLK, an input PDL4_IN to receive an input disparity bit from the first 8B/10B encoder circuits, and outputs abcdeifghj to generate encoded output bits based on the input bits and the input disparity bit. A port 700 of the type including the encoder system 400 also includes a deserializer 712 coupled to receive signals from an interface 710 and a decoder 714 coupled to receive deserialized signals from the deserializer 712 and to generate decoded signals. A first-in, first-out buffer 716 is coupled between the decoder 714 and the encoder system 400 to store the decoded signals and to provide the decoded signals to the encoder system 400, and a serializer 744 is coupled to receive the output signals from the encoder system 400, to serialize the output signals, and to transmit the output signals to the interface 746. A disc drive 300 of the type including the port 700 also includes a base 312, a disc 334 rotatably attached to the base 312, and a spindle motor 333 attached to the base 312 and coupled to rotate the disc 334. An actuator is attached to the base, one end of the actuator having a transducer and the other end of the actuator having a voice coil which forms a portion of a voice coil motor. A circuit 360 is coupled to the transducer to exchange signals with the transducer to read data from and write data to the disc 334, the circuit including the port 700 coupled to an interface. An information handling system 600 of the type including the disc drive 610 also includes a central processing unit 612 operatively coupled to the disc drive 610, a data storage device 620 operatively coupled to the central processing unit 612, and an input/output subsystem 616 operatively coupled to the central processing unit 612.

An information handling system 600 is also disclosed. The information handling system 600 includes a central processing unit 612 operatively coupled to an interface 640, a data storage device 620 operatively coupled to the interface 640, an input/output subsystem 616 operatively coupled to the interface 640, and a disc drive 610 operatively coupled to the interface 640 through a port 630. The port 630 includes an encoder system 400 which includes a first encoder circuit 410, 412 having a plurality of inputs ABCDEFGH coupled to receive a plurality of input signals, to encode the input signals, and to generate a disparity signal at an output PDL4_OUT based on the encoded input signals. The encoder system 400 also includes a second encoder circuit 414, 416 having a plurality of inputs ABCDEFGH coupled to receive the input signals and the disparity signal to encode the input signals into a plurality of output signals at a plurality of outputs abcdeifghj based on the disparity signal. The first encoder circuit 410, 412 may include one or more first 8B/10B encoder circuits 410, 412 each having input pins ABCDEFGH coupled to receive input bits, a clock input CLK, and an output pin PDL4_OUT to generate an output disparity bit, where an 8B/10B encoder circuit is defined as an encoder circuit to encode a byte having 8 bits into a transmission character having 10 bits according to a transmission code. The second encoder circuit 414, 416 may include one or more second 8B/10B encoder circuits 414, 416 each having input pins ABCDEFGH coupled to receive the input bits, a clock input CLK, an input PDL4_IN to receive an input disparity bit from the first 8B/10B encoder circuits 410, 412, and output pins abcdeifghj to generate encoded output bits based on the input bits and the input disparity bit. The port 630 may further include a deserializer 712 coupled to receive signals from the interface 640 and a decoder 714 coupled to receive deserialized signals from the deserializer 712 and to generate decoded signals. The port 630 may also include a first-in, first-out buffer 716 coupled between the decoder 714 and the encoder system 400 to store the decoded signals and to provide the decoded signals to the encoder system 400 and a serializer 744 coupled to receive the output signals from the encoder system 400, to serialize the output signals, and to transmit the output signals to the interface 640.

Also disclosed is an information handling system including a plurality of devices 610–620 coupled to each other through an interface 640 and a circuit for encoding signals transmitted over the interface in one or more of the devices.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of encoding comprising steps of:
   (a) receiving a plurality of input bits in a first encoder circuit;
   (b) encoding the input bits to generate encoded bits in the first encoder circuit;
   (c) generating an input disparity bit from the encoded bits;
   (d) receiving the input bits and the input disparity bit in a second encoder circuit; and
   (e) encoding the input bits into a plurality of output bits based on the input disparity bit in the second encoder circuit.

2. The method of claim 1 wherein generating step (c) comprises steps of:
   (c)(i) encoding the input bits to generate the encoded bits and an output disparity bit based on a disparity of the encoded bits in the first encoder circuit; and
   (c)(ii) generating the input disparity bit from the output disparity bit.

3. The method of claim 1 wherein generating step (c) comprises steps of:
   (c)(i) generating an input disparity bit to be equal to a preceding input disparity bit if the encoded bits have a neutral disparity; and
   (c)(ii) generating the input disparity bit to be different from the preceding input disparity bit if the encoded bits have a positive or a negative disparity.

4. The method of claim 1 wherein:
  receiving step (a) comprises receiving a plurality of input bits in a plurality of first encoder circuits in a first clock cycle;
  encoding step (b) comprises encoding the input bits to generate encoded bits in the first encoder circuits in the first clock cycle;
  generating step (c) comprises generating a plurality of output disparity bits based on a disparity of the encoded bits and generating a plurality of input disparity bits from the output disparity bits in the first clock cycle;
  receiving step (d) comprises receiving the input bits and the input disparity bits in a plurality of second encoder circuits in a second clock cycle following the first clock cycle; and
  encoding step (e) comprises encoding the input bits into a plurality of output bits having a disparity determined by the input disparity bits in the second encoder circuits in the second clock cycle.

5. The method of claim 1, further comprising storing a disparity bit to be used to encode a subsequent plurality of input bits into a plurality of output bits.

6. The method of claim 1 wherein:
  receiving step (a) comprises receiving a plurality of input bytes in a plurality of first 8B/10B encoder circuits in a first clock cycle, wherein an 8B/10B encoder circuit is defined as an encoder circuit to encode a byte having 8 bits into a transmission character having 10 bits according to a transmission code;
  encoding step (b) comprises encoding the input bytes to generate a plurality of transmission characters in the first 8B/10B encoder circuits in the first clock cycle;
  generating step (c) comprises generating a plurality of output disparity bits based on a disparity of the transmission characters and generating a plurality of input disparity bits from the output disparity bits in the first clock cycle;
  receiving step (d) comprises receiving the input bytes and the input disparity bits in a plurality of second 8B/10B encoder circuits in a second clock cycle following the first clock cycle; and
  encoding step (e) comprises encoding the input bytes into a plurality of transmission characters having a disparity determined by the input disparity bits in the second 8B/10B encoder circuits in the second clock cycle.

7. The method of claim 6 wherein generating step (c) comprises steps of:
  (c)(i) generating an output disparity bit for each transmission character indicating a disparity of the transmission character; and
  (c)(ii) generating an input disparity bit for each output disparity bit, the input disparity bit being the same as a preceding input disparity bit if the disparity of the corresponding transmission character is neutral and the input disparity bit being different from the preceding input disparity bit if the disparity of the corresponding transmission character is positive or negative.

8. The method of claim 6, further comprising storing one of the input disparity bits generated in the first clock cycle to be used to send to the second 8B/10B encoder circuits to encode a subsequent plurality of input bytes in a third clock cycle following the second clock cycle.

9. An encoder system comprising:
  a first encoder circuit having a plurality of inputs coupled to receive a plurality of input signals, to encode the input signals into encoded input signals, and to generate a disparity signal at an output based on the encoded input signals; and
  a second encoder circuit having a plurality of inputs coupled to receive the input signals and the disparity signal to encode the input signals into a plurality of output signals at a plurality of outputs based on the disparity signal.

10. The encoder system of claim 9 wherein:
  the first encoder circuit comprises one or more first encoder circuits each having input pins coupled to receive input bits, a clock input, and an output pin to generate an output disparity bit; and
  the second encoder circuit comprises one or more second encoder circuits each having input pins coupled to receive the input bits, a clock input, an input to receive an input disparity bit from the first encoder circuits, and output pins to generate encoded output bits based on the input bits and the input disparity bit.

11. The encoder system of claim 10, further comprising:
  an exclusive-OR gate for each first encoder circuit, each exclusive-OR gate having a first input coupled to the output pin of a corresponding first encoder circuit to receive the output disparity bit and a second input coupled to receive a preceding input disparity bit, the exclusive-OR gate having an output to generate a subsequent input disparity bit;
  a current storage element for each exclusive-OR gate, each current storage element to store the subsequent input disparity bit and to relay the input disparity bit to a respective one of the second encoder circuits in a subsequent clock cycle; and
  a carryover storage element to store the subsequent input disparity bit of one of the first encoder circuits to a subsequent clock cycle.

12. The encoder system of claim 11 wherein the current storage elements and the carryover storage element each comprise a D flip-flop.

13. The encoder system of claim 9 wherein:
  the first encoder circuit comprises two first 8B/10B encoder circuits each having input pins coupled to receive input bits, a clock input, an output pin to generate an output disparity bit, wherein an 8B/10B encoder circuit is defined as an encoder circuit to encode a byte having 8 bits into a transmission character having 10 bits according to a transmission code; and
  the second encoder circuit comprises two second 8B/10B encoder circuits each having input pins coupled to receive the input bits, a clock input, an input to receive an input disparity bit from the first 8B/10B encoder circuits, and outputs to generate encoded output bits based on the input bits and the input disparity bit.

14. A port of the type including the encoder system of claim 9 and further comprising:
  a deserializer coupled to receive signals from an interface;
  a decoder coupled to receive deserialized signals from the deserializer and to generate decoded signals;
  a first-in, first-out buffer coupled between the decoder and the encoder system to store the decoded signals and to provide the decoded signals to the encoder system; and
  a serializer coupled to receive the output signals from the encoder system, to serialize the output signals, and to transmit the output signals to the interface.

15. A disc drive of the type including the port of claim 14 and further comprising:
   a base;
   a disc rotatably attached to the base;
   a spindle motor attached to the base and coupled to rotate the disc;
   an actuator attached to the base, one end of the actuator having a transducer and another end of the actuator having a voice coil which forms a portion of a voice coil motor; and
   a circuit coupled to the transducer to exchange signals with the transducer to read data from and write data to the disc, the circuit including the port coupled to the interface.

16. An information handling system of the type including the disc drive of claim 15 and further comprising:
   a central processing unit operatively coupled to the disc drive;
   a data storage device operatively coupled to the central processing unit; and
   an input/output subsystem operatively coupled to the central processing unit.

17. An information handling system comprising:
   a central processing unit operatively coupled to an interface;
   a data storage device operatively coupled to the interface;
   an input/output subsystem operatively coupled to the interface; and
   a disc drive operatively coupled to the interface through a port, the port comprising an encoder system, the encoder system comprising:
      a first encoder circuit having a plurality of inputs coupled to receive a plurality of input signals, to encode the input signals into encoded input signals, and to generate a disparity signal at an output based on the encoded input signals; and
      a second encoder circuit having a plurality of inputs coupled to receive the input signals and the disparity signal to encode the input signals into a plurality of output signals at a plurality of outputs based on the disparity signal.

18. The information handling system of claim 17 wherein:
   the first encoder circuit comprises one or more first 8B/10B encoder circuits each having input pins coupled to receive input bits, a clock input, and an output pin to generate an output disparity bit, wherein an 8B/10B encoder circuit is defined as an encoder circuit to encode a byte having 8 bits into a transmission character having 10 bits according to a transmission code; and
   the second encoder circuit comprises one or more second 8B/10B encoder circuits each having input pins coupled to receive the input bits, a clock input, an input to receive an input disparity bit from the first 8B/10B encoder circuits, and output pins to generate encoded output bits based on the input bits and the input disparity bit.

19. The information handling system of claim 17 wherein the port further comprises:
   a deserializer coupled to receive signals from the interface;
   a decoder coupled to receive deserialized signals from the deserializer and to generate decoded signals;
   a first-in, first-out buffer coupled between the decoder and the encoder system to store the decoded signals and to provide the decoded signals to the encoder system; and
   a serializer coupled to receive the output signals from the encoder system, to serialize the output signals, and to transmit the output signals to the interface.

* * * * *

UNITED STATES PATENT AND TRADEMARK OFFICE
CERTIFICATE OF CORRECTION

PATENT NO.    : 6,295,010 B1
DATED         : September 25, 2001
INVENTOR(S)   : Charles W. Thiesfeld It is certified that error appears in the above-identified patent and that said Letters Patent is hereby corrected as shown below:

<u>Title page, Item [54] and Column 1, line 1,</u>
Title, insert -- WITH TWO ENCODER CIRCUITS -- between "SYSTEM" and "AND METHOD".

<u>Column 2,</u>
Lines 43-44, the text beginning with "According to one embodiment of the present invention…" should be a separate paragraph.

<u>Column 6,</u>
Line 61, delete "cycle B" and insert -- cycle II --, therefor.

Signed and Sealed this

Sixteenth Day of July, 2002

*Attest:*

JAMES E. ROGAN
*Attesting Officer*   Director of the United States Patent and Trademark Office